(12) United States Patent
Ogawa et al.

(10) Patent No.: US 8,953,390 B2
(45) Date of Patent: Feb. 10, 2015

(54) SEMICONDUCTOR MEMORY DEVICE

(71) Applicant: Kabushiki Kaisha Toshiba, Minato-ku (JP)

(72) Inventors: Masatsugu Ogawa, Kanagawa-ken (JP); Teruo Takagiwa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/014,944

(22) Filed: Aug. 30, 2013

(65) Prior Publication Data
US 2014/0286108 A1 Sep. 25, 2014

(30) Foreign Application Priority Data
Mar. 21, 2013 (JP) ................... 2013-059134

(51) Int. Cl.
*G11C 7/10* (2006.01)
(52) U.S. Cl.
CPC ........................................ *G11C 7/10* (2013.01)
USPC ............ 365/189.05; 365/185.06; 365/185.11; 365/63; 365/154; 365/189.011; 365/189.17

(58) Field of Classification Search
USPC .......... 365/185.06, 185.11, 63, 154, 189.011, 365/189.17, 189.05
See application file for complete search history.

(56) References Cited

U.S. PATENT DOCUMENTS

2010/0299475 A1* 11/2010 Yano ............................. 711/103

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

According to one embodiment, a semiconductor memory device includes n (n being a natural number of 2 or more) data retention circuits connected to a data input/output terminal; n buses connected respectively to the n data retention circuits; m×n data latch circuits connected to the buses, with m (m being a natural number of 2 or more) data latch circuits being connected per one of the buses; and a selection circuit configured to simultaneously perform data transfer from/to the data retention circuits for a plurality of the data latch circuits in units of a group including the plurality of the data latch circuits, the data latch circuits being divided into the groups so that not all the data latch circuits connected to the same bus are included in the same group.

15 Claims, 10 Drawing Sheets

SEMICONDUCTOR MEMORY DEVICE

CROSS-REFERENCE TO RELATED APPLICATION

This application is based upon and claims the benefit of priority from Japanese Patent Application No. 2013-059134, filed on Mar. 21, 2013; the entire contents of which are incorporated herein by reference.

FIELD

Embodiments described herein relate generally to a semiconductor memory device.

BACKGROUND

As a circuit for controlling bit lines of a memory cell array, there is known a circuit including a plurality of data retention circuits for temporarily storing data supplied from a data input/output terminal, a plurality of buses connected respectively to the plurality of data retention circuits, and a plurality of data latch circuits connected commonly to one bus.

The data temporarily stored in the data retention circuit is transferred to the data latch circuits via the bus. The potential of the bit line is controlled in response to the data of the data latch circuit.

DETAILED DESCRIPTION

Figure 1:
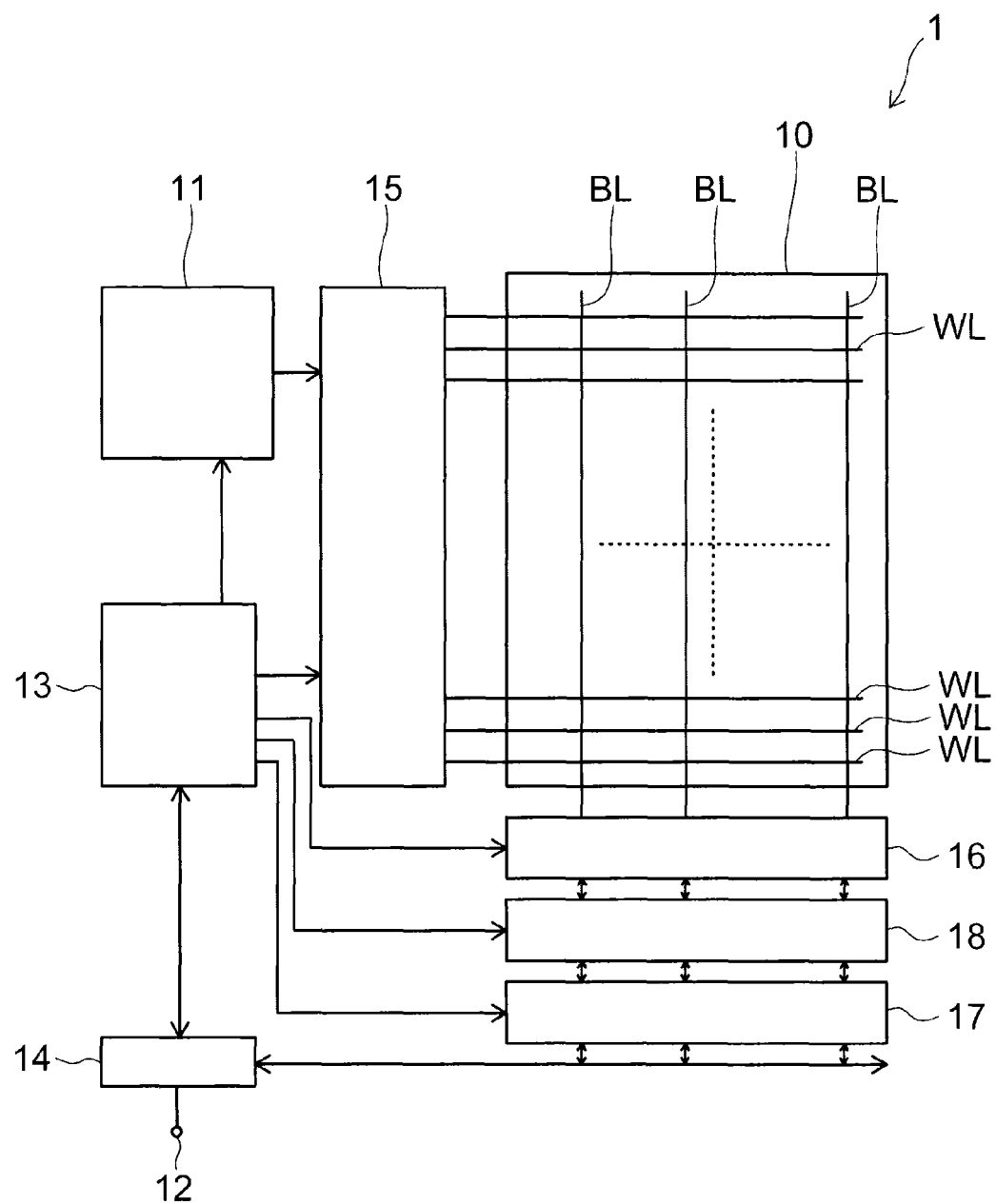
FIG. 1 is a schematic view showing a configuration of a semiconductor memory device of an embodiment.

According to one embodiment, a semiconductor memory device includes n (n being a natural number of 2 or more) data retention circuits connected to a data input/output terminal; n buses connected respectively to the n data retention circuits; m×n data latch circuits connected to the buses, with m (m being a natural number of 2 or more) data latch circuits being connected per one of the buses; and a selection circuit configured to simultaneously perform data transfer from/to the data retention circuits for a plurality of the data latch circuits in units of a group including the plurality of the data latch circuits, the data latch circuits being divided into the groups so that not all the data latch circuits connected to the same bus are included in the same group.

Embodiments will now be described with reference to the drawings. In the drawings, like elements are labeled with like reference numerals.

FIG. 1 is a schematic view showing the configuration of a semiconductor memory device 1 of an embodiment.

The semiconductor memory device 1 of the embodiment includes a memory cell array 10 and a control circuit (peripheral circuit) for controlling the operation of the memory cell array 10. The memory cell array 10 and the control circuit are integrated on the same substrate (one chip).

The memory cell array 10 includes a plurality of memory cells, a plurality of bit lines BL, and a plurality of word lines WL. The bit lines BL and the word lines WL intersect (e.g., are orthogonal to) each other.

At the intersecting positions of the bit lines BL and the word lines WL, the plurality of memory cells are arranged in a matrix. The memory cell has a structure in which a control electrode is stacked via an intermediate insulating film on a charge accumulation layer such as a floating electrode or a charge trap film.

The control circuit includes a voltage generating circuit 11, a control section 13, a row decoder 15, a data input/output buffer 14, a sense amplifier 16, a column decoder 17, a page buffer 18 and the like. The control circuit writes, erases, and reads data in the memory cells.

The word lines WL are connected to the row decoder 15. The row decoder 15 selects and drives the word lines WL.

The bit lines BL are connected to the sense amplifier 16. The sense amplifier 16 senses the read data.

The data input/output buffer 14 is connected between a data input/output terminal 12 and the column decoder 17. The data input/output buffer 14 receives command data and address data. The column decoder 17 selects the bit lines BL.

Between the column decoder 17 and the sense amplifier 16, the page buffer 18 is connected. The page buffer 18 retains write data.

The control section 13 receives an external control signal such as a write enable signal, read enable signal, address latch enable signal, and command latch enable signal from a host or memory controller. The control section 13 then controls the overall operation of the memory cell array 10, such as sequence control and application voltage control for reading, writing, and erasing data.

The voltage generating circuit 11 includes a plurality of booster circuits and a pulse generating circuit. Based on the control signal from the control section 13, the voltage generating circuit 11 switches the number of booster circuits being driven. Furthermore, the voltage generating circuit 11 controls the pulse generating circuit to adjust the pulse width and pulse height of the pulse voltage supplied to the row decoder 15.

Next, the page buffer 18 is described.

Figure 2:
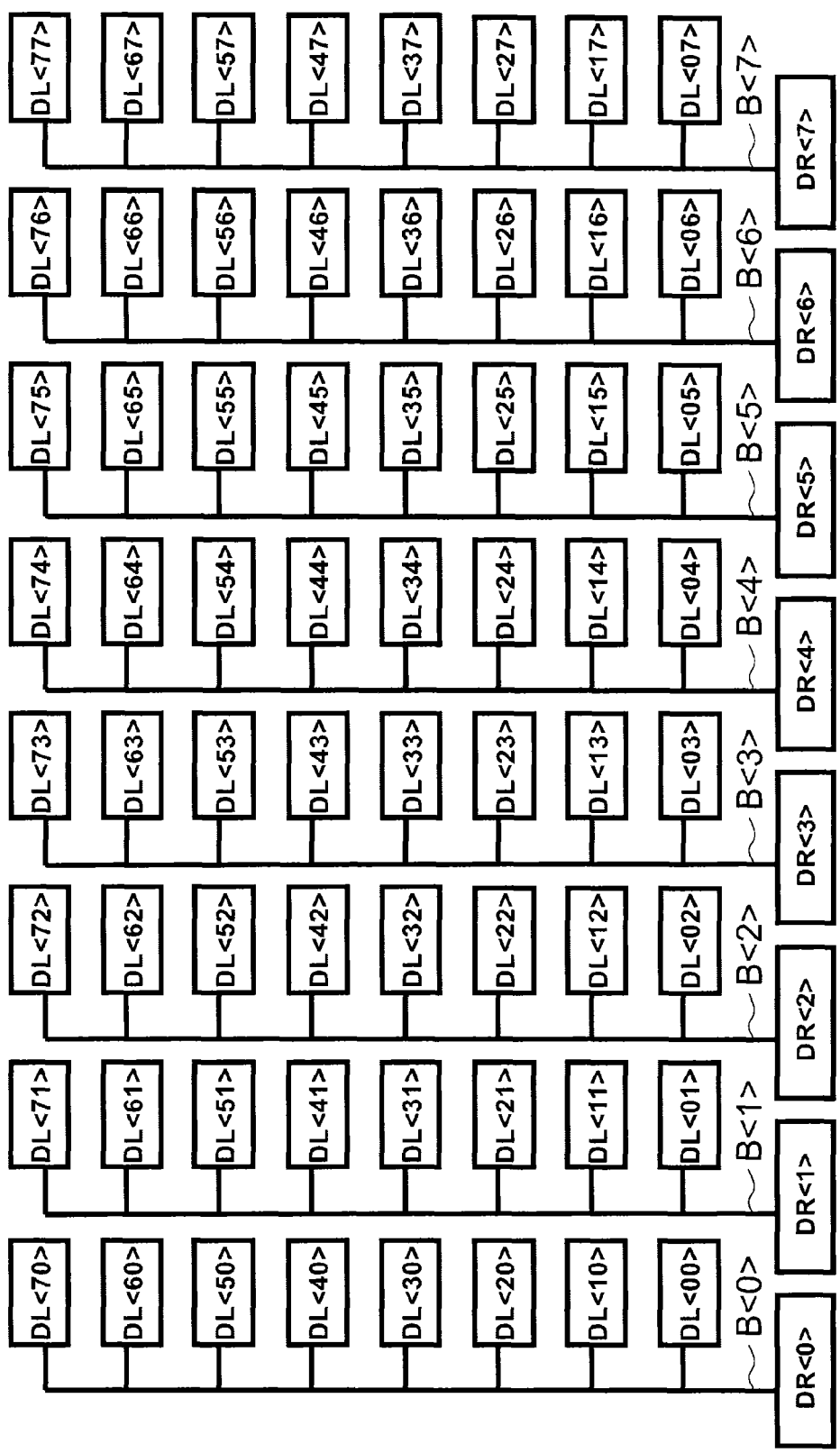
FIG. 2 is a schematic view of a part of a control circuit of the semiconductor memory device of the embodiment.

As shown in FIG. 2, the page buffer 18 includes a plurality of data retention circuits DR<0>-<7>, a plurality of buses (data buses) B<0>-<7>, and a plurality of data latch circuits DL<00>-<77>. Here, the number of elements is not limited to that shown in the figure.

FIG. 2 is a schematic view showing an example of physical connection among the data retention circuits DR<0>-<7>, the buses (data buses) B<0>-<7>, and the data latch circuits DL<00>-<77>.

In the following, the data retention circuits DR<0>-<7> may also be simply denoted as data retention circuits DR without distinction among the individual data retention circuits. Similarly, the buses B<0>-<7> may also be simply denoted as buses B without distinction among the individual buses. Similarly, the data latch circuits DL<00>-<77> may also be simply denoted as data latch circuits DL without distinction among the individual data latch circuits.

Each of the plurality of (e.g., eight) data retention circuits DR<0>-<7> is connected to the data input/output terminal 12 via the data input/output buffer 14 and the column decoder 17.

To each of the data retention circuits DR<0>-<7>, one bus B is connected. To one bus B, a plurality of (e.g., eight) data latch circuits DL are connected. The number of data retention circuits DR and the number of buses B are each denoted by n (n being a natural number of 2 or more). The number of data latches DL connected to one bus B is denoted by m (m being a natural number of 2 or more). Then, m×n data latch circuits DL are provided.

The data inputted from the data input/output terminal 12 is temporarily stored in the data retention circuits DR. The data is transferred from the data retention circuit DR via the bus B to the data latch circuits DL.

The individual data latch circuits DL are provided corresponding to the individual bit lines BL. In response to the data transferred to the data latch circuit DL, the potential of the corresponding bit line BL is controlled.

Figure 3:
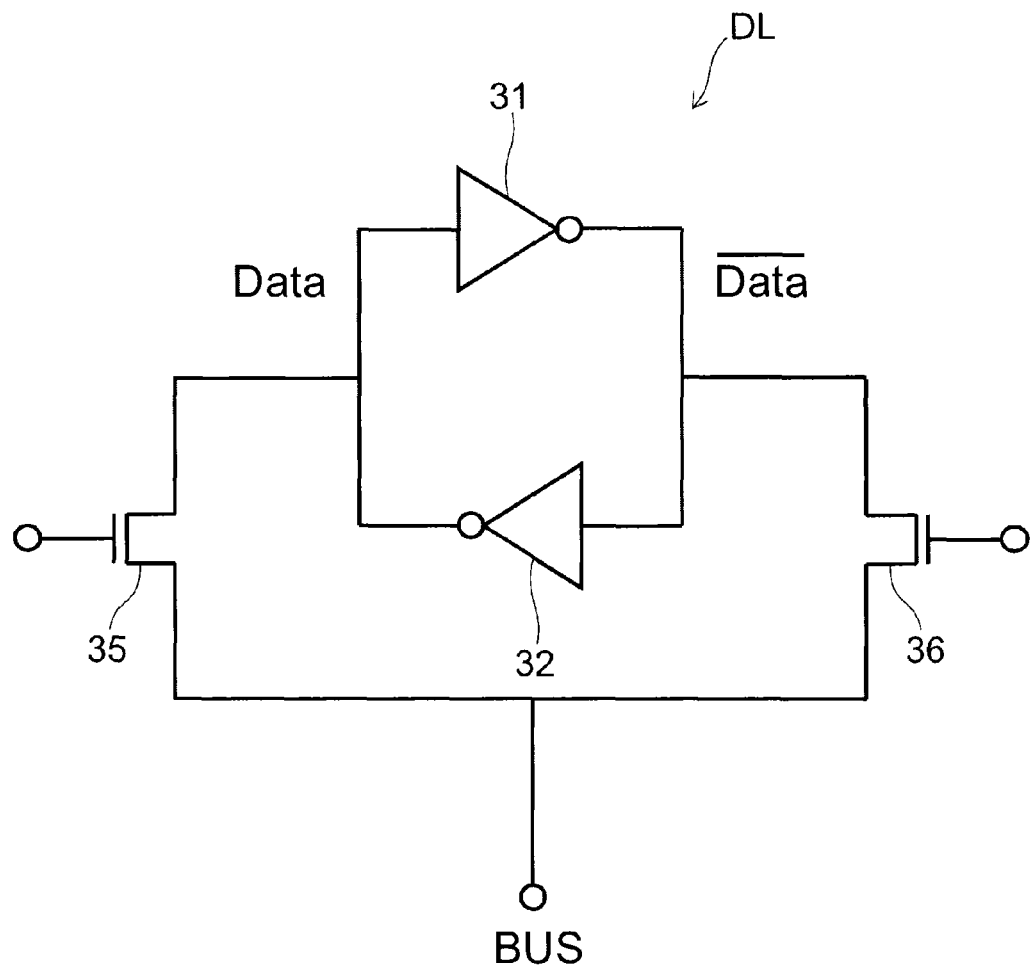
FIG. 3 is a schematic view of a data latch circuit.

FIG. 3 is a schematic view showing an example of the configuration of the data latch circuit DL.

To the bus B, two inverter circuits 31, 32 are parallel connected in opposite directions. Thus, inside the data latch circuit DL, data and its inverted data are stored. Arbitrary data is inputted/outputted between the bus B and the data latch circuit DL by the gate control of transistors 35, 36 serving as switching elements connected between the bus B and the inverter circuits 31, 32.

Here, as a comparative example, an operating method for data input can be considered in which each data retention circuit DR sequentially accesses the individual data latch circuits DL one by one via the bus B. However, this requires a very long time for inputting data to all the data latch circuits DL, and also involves high current consumption.

Figure 11:
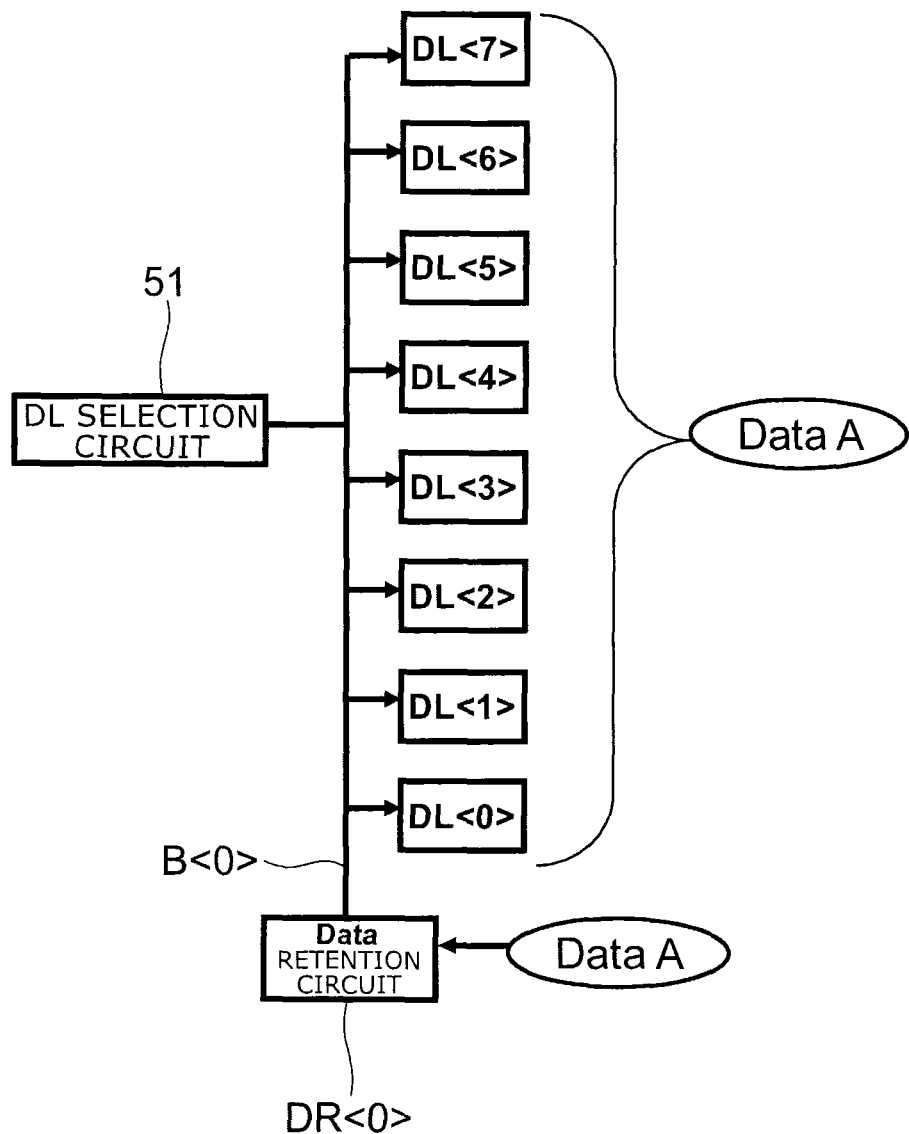
FIG. 11 is a schematic view of a part of a control circuit of a semiconductor memory device of a comparative example.

As another comparative example, as shown in FIG. 11, the following approach can be considered. A circuit 51 for selecting access from the bus B to the data latch circuits DL is used to simultaneously access all the data latch circuits DL linked to one common bus B. Thus, data is transferred from the data retention circuit DR to improve the data input speed.

However, in this approach, all the data latch circuits DL are driven in the state in which all the data latch circuits DL are linked to one data retention circuit DR and one bus B. This causes the problem of the increase of power consumption, power supply drop, and instantaneous voltage peak.

Thus, according to the embodiment, m×n data latch circuits DL are divided into groups so that not all the m data latch circuits DL connected to the same bus B are included in the same group. In units of the group including a plurality of data latch circuits DL, data transfer from/to the data retention circuit DR is simultaneously performed for the plurality of data latch circuits DL.

First Embodiment

Figure 4:
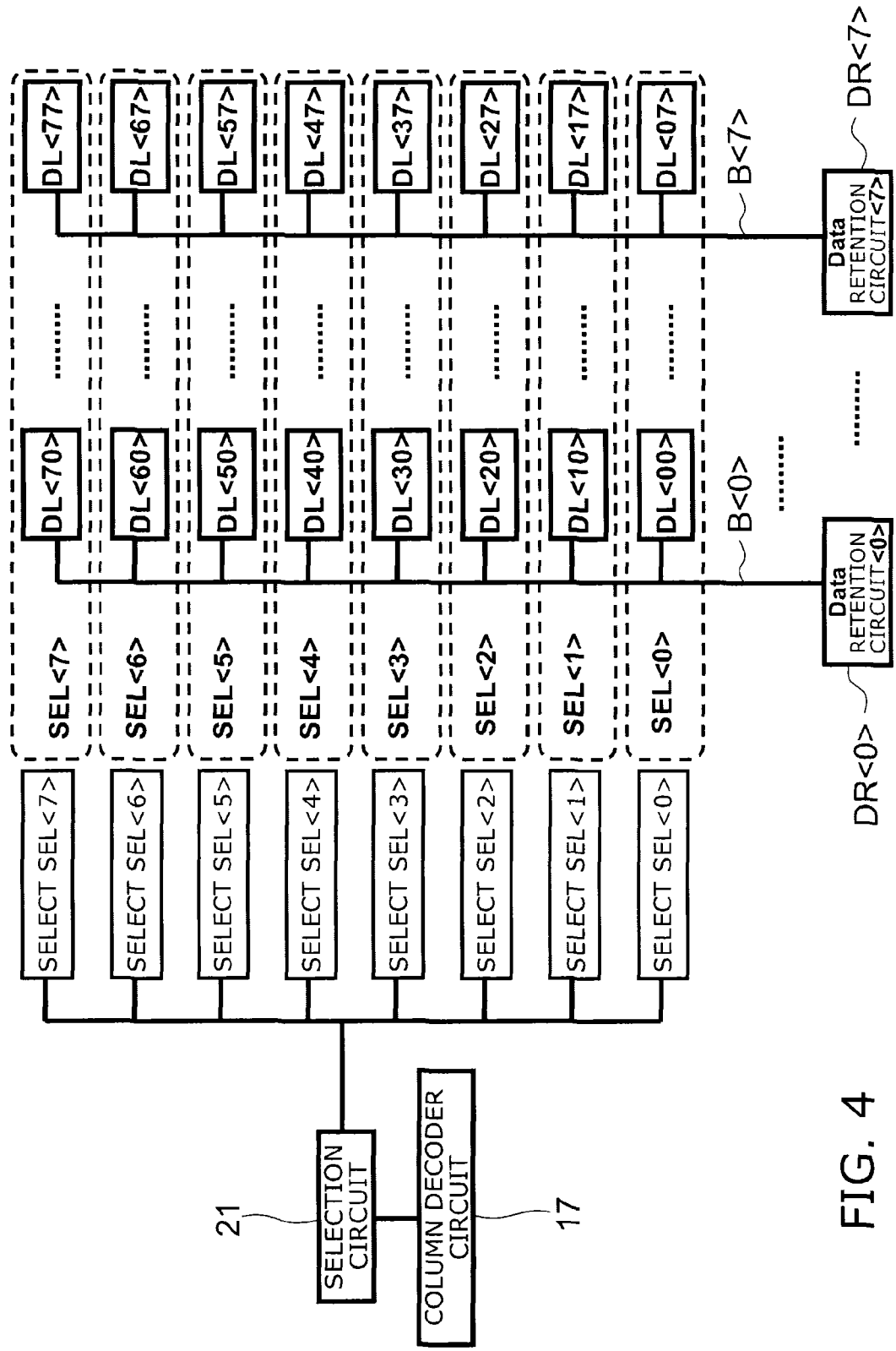
FIG. 4 is a schematic view of a part of a control circuit of a semiconductor memory device of a first embodiment.

FIG. 4 is a schematic view showing the configuration of a connection circuit between the data retention circuits DR and the data latch circuits DL according to a first embodiment.

According to the first embodiment, a selection circuit 21 for allowing access to a plurality of data latch circuits DL in units of the aforementioned group is connected to the connection circuit between the bus B and the data latch circuits DL.

The circuit shown in FIG. 4 is incorporated between the sense amplifier 16 linked to the memory cells, and the column decoder 17 for selecting the bit lines BL.

For instance, m×n data latch circuits DL are divided into eight groups SEL<0>-<7>. The groups SEL<0>-<7> may also be simply denoted as groups SEL without distinction among the individual groups SEL<0>-<7>.

The group SEL<0> includes eight data latch circuits DL each in first place counting from the data retention circuit DR side in FIG. 2. That is, the group SEL<0> includes a data latch circuit DL<00> connected to the bus B<0>, a data latch circuit DL<01> connected to the bus B<1>, a data latch circuit DL<02> connected to the bus B<2>, a data latch circuit DL<03> connected to the bus B<3>, a data latch circuit DL<04> connected to the bus B<4>, a data latch circuit DL<05> connected to the bus B<5>, a data latch circuit DL<06> connected to the bus B<6>, and a data latch circuit DL<07> connected to the bus B<7>.

The group SEL<1> includes eight data latch circuits DL each in second place counting from the data retention circuit DR side in FIG. 2. That is, the group SEL<1> includes a data latch circuit DL<10> connected to the bus B<0>, a data latch circuit DL<11> connected to the bus B<1>, a data latch circuit DL<12> connected to the bus B<2>, a data latch circuit DL<13> connected to the bus B<3>, a data latch circuit DL<14> connected to the bus B<4>, a data latch circuit DL<15> connected to the bus B<5>, a data latch circuit DL<16> connected to the bus B<6>, and a data latch circuit DL<17> connected to the bus B<7>.

The group SEL<2> includes eight data latch circuits DL each in third place counting from the data retention circuit DR side in FIG. 2. That is, the group SEL<2> includes a data latch circuit DL<20> connected to the bus B<0>, a data latch circuit DL<21> connected to the bus B<1>, a data latch circuit DL<22> connected to the bus B<2>, a data latch circuit DL<23> connected to the bus B<3>, a data latch circuit DL<24> connected to the bus B<4>, a data latch circuit DL<25> connected to the bus B<5>, a data latch circuit DL<26> connected to the bus B<6>, and a data latch circuit DL<27> connected to the bus B<7>.

The group SEL<3> includes eight data latch circuits DL each in fourth place counting from the data retention circuit DR side in FIG. 2. That is, the group SEL<3> includes a data latch circuit DL<30> connected to the bus B<0>, a data latch circuit DL<31> connected to the bus B<1>, a data latch circuit DL<32> connected to the bus B<2>, a data latch circuit DL<33> connected to the bus B<3>, a data latch circuit DL<34> connected to the bus B<4>, a data latch circuit DL<35> connected to the bus B<5>, a data latch circuit DL<36> connected to the bus B<6>, and a data latch circuit DL<37> connected to the bus B<7>.

The group SEL<4> includes eight data latch circuits DL each in fifth place counting from the data retention circuit DR side in FIG. 2. That is, the group SEL<4> includes a data latch circuit DL<40> connected to the bus B<0>, a data latch circuit DL<41> connected to the bus B<1>, a data latch circuit DL<42> connected to the bus B<2>, a data latch circuit DL<43> connected to the bus B<3>, a data latch circuit DL<44> connected to the bus B<4>, a data latch circuit DL<45> connected to the bus B<5>, a data latch circuit DL<46> connected to the bus B<6>, and a data latch circuit DL<47> connected to the bus B<7>.

The group SEL<5> includes eight data latch circuits DL each in sixth place counting from the data retention circuit DR side in FIG. 2. That is, the group SEL<5> includes a data latch circuit DL<50> connected to the bus B<0>, a data latch circuit DL<51> connected to the bus B<1>, a data latch circuit DL<52> connected to the bus B<2>, a data latch circuit DL<53> connected to the bus B<3>, a data latch circuit DL<54> connected to the bus B<4>, a data latch circuit DL<55> connected to the bus B<5>, a data latch circuit DL<56> connected to the bus B<6>, and a data latch circuit DL<57> connected to the bus B<7>.

The group SEL<6> includes eight data latch circuits DL each in seventh place counting from the data retention circuit DR side in FIG. 2. That is, the group SEL<6> includes a data latch circuit DL<60> connected to the bus B<0>, a data latch circuit DL<61> connected to the bus B<1>, a data latch circuit DL<62> connected to the bus B<2>, a data latch circuit DL<63> connected to the bus B<3>, a data latch circuit DL<64> connected to the bus B<4>, a data latch circuit DL<65> connected to the bus B<5>, a data latch circuit DL<66> connected to the bus B<6>, and a data latch circuit DL<67> connected to the bus B<7>.

The group SEL<7> includes eight data latch circuits DL each in eighth place counting from the data retention circuit DR side in FIG. 2. That is, the group SEL<7> includes a data latch circuit DL<70> connected to the bus B<0>, a data latch circuit DL<71> connected to the bus B<1>, a data latch circuit DL<72> connected to the bus B<2>, a data latch circuit DL<73> connected to the bus B<3>, a data latch circuit DL<74> connected to the bus B<4>, a data latch circuit DL<75> connected to the bus B<5>, a data latch circuit DL<76> connected to the bus B<6>, and a data latch circuit DL<77> connected to the bus B<7>.

That is, in each group SEL, only one data latch circuit DL is connected to the same bus B.

The selection circuit 21 outputs a selection signal High to one group SEL. Then, the data latch circuits DL included in the selected group SEL are simultaneously selected. Thus, from each data retention circuit DR linked with those data latch circuits DL, data is transferred via the corresponding bus B to the data latch circuits DL included in the group SEL.

Then, in synchronization with the rise or fall timing of a clock signal (clock pulse) inputted to the selection circuit 21, the selection signal for selecting the next group SEL is set to High and switches to accessing the next group SEL.

For instance, first, the signal for selecting the group SEL<0> is set to High, and the signal for selecting the other groups SEL<1>-<7> is set to Low. Thus, the data latch circuits DL included in the group SEL<0> are selected, and data is transferred to the data latch circuits DL included in the group SEL<0>.

Next, at the timing after a lapse of a prescribed number of clocks (e.g., one clock) from the selection of the group SEL<0>, the signal for selecting the group SEL<1> is set to High, and the signal for selecting the other groups SEL<0>, <2>-<7> is set to Low. Thus, the data latch circuits DL included in the group SEL<1> are selected, and data is transferred to the data latch circuits DL included in the group SEL<1>.

Subsequently, in steps of one clock, the groups SEL<2>-<7> are selected, and data is transferred to the m×n data latch circuits DL.

In one write operation, only one data latch circuit DL is selected per one bus B. This can suppress power supply drop in the bus B. Furthermore, for each selected group SEL, a plurality of data latch circuits DL can be simultaneously subjected to data write. For instance, according to the first embodiment, in eight clock operations, data can be transferred to all the data latch circuits DL. This can reduce the write operation time.

That is, according to the first embodiment, at the time of data write to memory cells, the unit of accessing a plurality of data latch circuits DL is divided into a plurality of groups SEL. Furthermore, data is written to the data latch circuits DL in the same group SEL. This allows compatibility between the improvement of data write speed and the reduction of power consumption.

Second Embodiment

Figure 5:
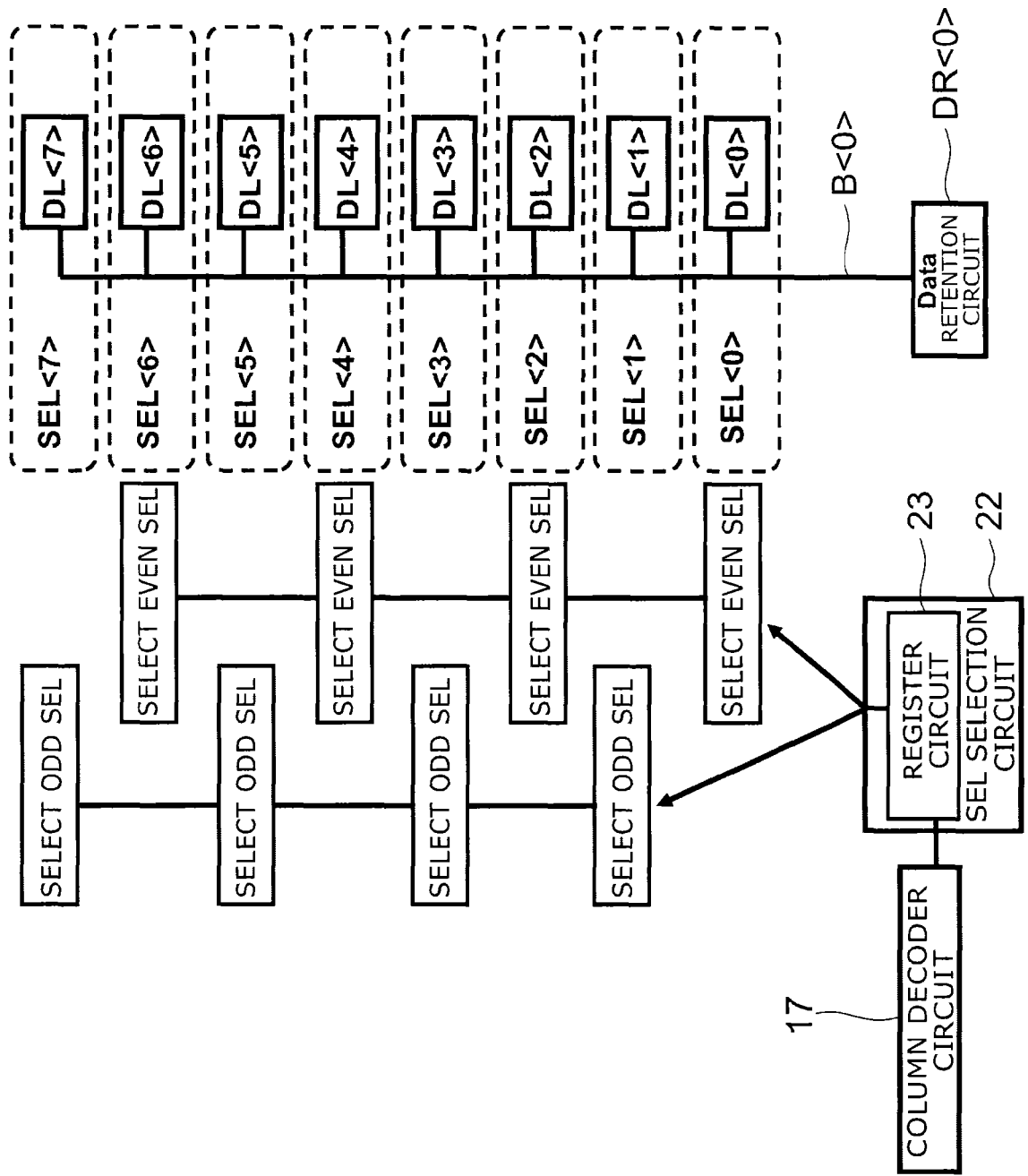
FIG. 5 is a schematic view of a part of a control circuit of a semiconductor memory device of a second embodiment.

FIG. 5 is a schematic view showing the configuration of a connection circuit between the data retention circuits DR and the data latch circuits DL according to a second embodiment.

According to the second embodiment, a register circuit 23 is provided in the selection circuit 22 for selecting the groups SEL. The register circuit 23 simultaneously selects a plurality of groups SEL.

In the example shown in FIG. 5, the register circuit 23 selects a plurality of groups SEL<0>, <2>, <4>, <6> in even-numbered places or a plurality of groups SEL<1>, <3>, <5>, <7> in odd-numbered places counting from the data retention circuit DR side.

For instance, first, the register circuit 23 selects the even-numbered groups SEL<0>, <2>, <4>, <6>. The signal for selecting the even-numbered groups SEL<0>, <2>, <4>, <6> is set to High, and the signal for selecting the odd-numbered groups SEL<1>, <3>, <5>, <7> is set to Low. Thus, the data latch circuits DL included in the even-numbered groups SEL<0>, <2>, <4>, <6> are selected, and data is transferred to the data latch circuits DL included in the even-numbered groups SEL<0>, <2>, <4>, <6>.

Next, the register circuit 23 selects the odd-numbered groups SEL<1>, <3>, <5>, <7>. The signal for selecting the odd-numbered groups SEL<1>, <3>, <5>, <7> is set to High, and the signal for selecting the even-numbered groups SEL<0>, <2>, <4>, <6> is set to Low. Thus, the data latch circuits DL included in the odd-numbered groups SEL<1>, <3>, <5>, <7> are selected, and data is transferred to the data latch circuits DL included in the odd-numbered groups SEL<1>, <3>, <5>, <7>.

The register circuit 23 is connected to the column decoder 17 for receiving input of address data corresponding to the selection signal of the bit line BL. Under the control of the column decoder 17, the register circuit 23 selects the groups SEL.

For m data latch circuits DL connected to the same one bus B, the adjacent data latch circuits DL are not simultaneously selected. That is, the adjacent bit lines BL arranged corresponding to the arrangement of the data latch circuits DL are not simultaneously selected. Thus, the potential of the selected bit line BL is not affected by the adjacent bit line BL.

Figure 6:
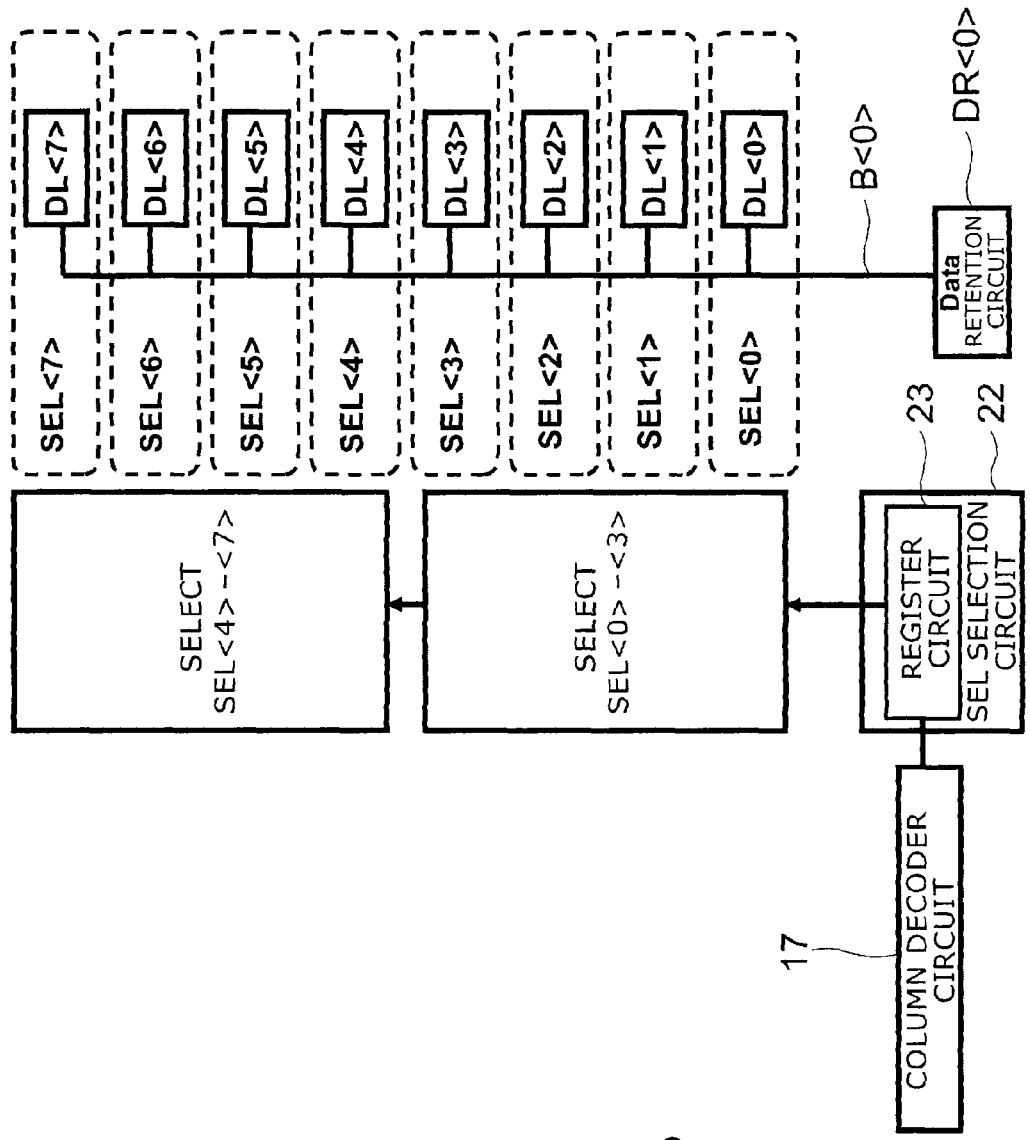
FIG. 6 is a schematic view of a part of a control circuit of a semiconductor memory device of a second embodiment.

FIG. 6 is a schematic view showing the configuration of a connection circuit between the data retention circuits DR and the data latch circuits DL according to a variation of the second embodiment.

In the example shown in FIG. 6, the register circuit 23 selects a plurality of groups SEL<0>-<3> in first to fourth places or a plurality of groups SEL<4>-<7> in fifth to eighth places counting from the data retention circuit DR side.

For instance, first, the register circuit 23 selects the groups SEL<0>-<3>. The signal for selecting the groups SEL<0>-<3> is set to High, and the signal for selecting the other groups SEL<4>-<7> is set to Low. Thus, the data latch circuits DL included in the groups SEL<0>-<3> are selected, and data is transferred to the data latch circuits DL included in the groups SEL<0>-<3>.

Next, under the control of the column decoder 17, the register circuit 23 selects the groups SEL<4>-<7>. The signal for selecting the groups SEL<4>-<7> is set to High, and the signal for selecting the other groups SEL<0>-<3> is set to Low. Thus, the data latch circuits DL included in the groups SEL<4>-<7> are selected, and data is transferred to the data latch circuits DL included in the groups SEL<4>-<7>.

In one write operation, not all the m data latch circuits DL connected to the same one bus B are selected. This can suppress power supply drop in the bus B. Furthermore, for each selected group SEL, a plurality of data latch circuits DL can be subjected to data write. This can reduce the write operation time.

Also in the second embodiment, at the time of data write to memory cells, the unit of accessing a plurality of data latch circuits DL is divided into a plurality of groups SEL. Furthermore, data is written to the data latch circuits DL in the same group SEL. This allows compatibility between the improvement of data write speed and the reduction of power consumption.

Furthermore, according to the second embodiment, a plurality of groups are selected by the register circuit 23. Thus, data can be transferred to all the data latch circuits DL faster than by sequentially selecting the groups SEL one by one as in the first embodiment.

In FIGS. 5 and 6, only one data retention circuit DR and one bus B are illustrated. However, in reality, as in FIGS. 2 and 4, they are provided in a plurality. In the example of FIG. 5, the selection circuit 22 selects the data latch circuits DL belonging to the even-numbered groups SEL<0>, <2>, <4>, <6> or the odd-numbered groups SEL<1>, <3>, <5>, <7>. In the example of FIG. 6, the selection circuit 22 selects the data latch circuits DL belonging to the groups SEL<0>-<3> or the groups SEL<4>-<7>.

Third Embodiment

Figure 7:
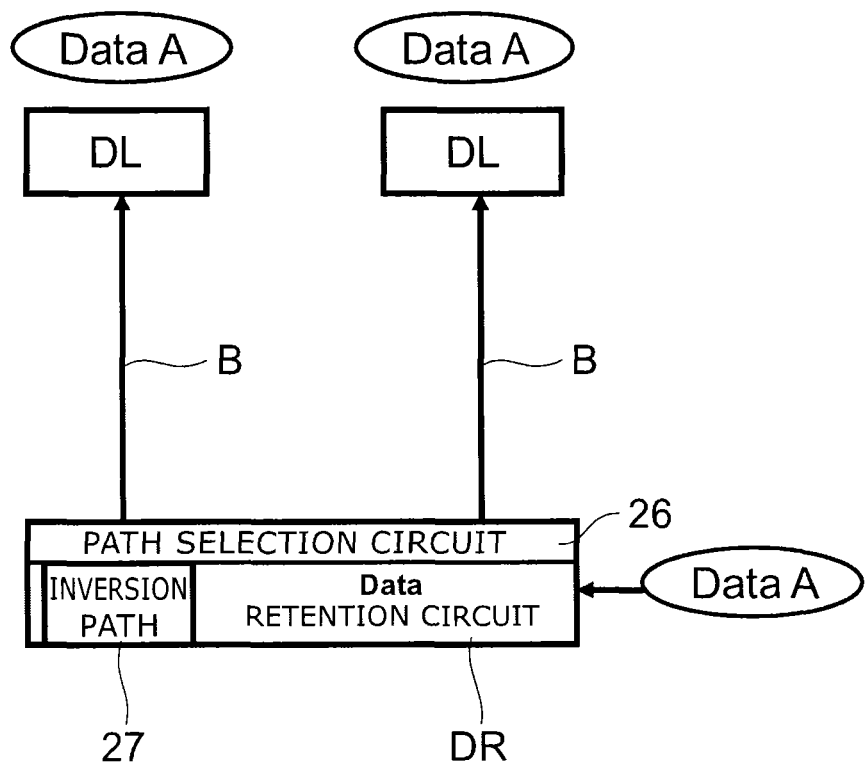
FIG. 7 is a schematic view of a part of a control circuit of a semiconductor memory device of a third embodiment.

FIG. 7 is a schematic view showing the configuration of a connection circuit between the data retention circuits DR and the data latch circuits DL according to a third embodiment.

According to the third embodiment, a path selection circuit 26 is incorporated between the data retention circuit DR and the bus B.

In operation tests and the like of a memory chip, random data may be written to the data latch circuits DL. In this case, conventionally, the problem is that if data A is inputted to the data retention circuit DR, only the same data A can be transferred to all the m data latch circuits DL linked to the bus B connected to that data retention circuit DR.

Furthermore, in general, due to the influence of the voltage in the plurality of data latch circuits DL connected to the data retention circuit DR via one bus B, reset operation is needed in inputting different data to the data retention circuit DR. Writing different data takes operation time and consumes electrical power for each writing operation.

The data retention circuit DR has a typical latch circuit structure. Thus, the data retention circuit DR simultaneously stores the inverted data A-bar of the inputted data A.

According to the third embodiment, the data retention circuit DR is used not only as a circuit for temporarily storing data, but also the stored data is reused. Thus, from one original data (input data), a plurality of different data can be outputted to the data latch circuits DL.

The path selection circuit 26 selects the input data A side or the inverted data A-bar side of the connection path to the data latch circuits DL. First, data A is inputted to the data retention circuit DR. Then, if the normal path is selected, the input data A is inputted to the data latch circuits DL via the bus B. If the inversion path 27 is selected, the inverted data A-bar of the input data A is inputted to the data latch circuits DL via the bus B.

Without overwriting different data to the data retention circuit DR by reset operation of the data retention circuit DR, the data already inputted to the data retention circuit DR can be utilized to create data different from the inputted data.

From one kind of original data (input data), two kinds of data can be created. This can enhance randomness of data written to the data latch circuits DL while reducing the operation time and current consumption for overwriting the data retention circuit.

Fourth Embodiment

Figure 8:
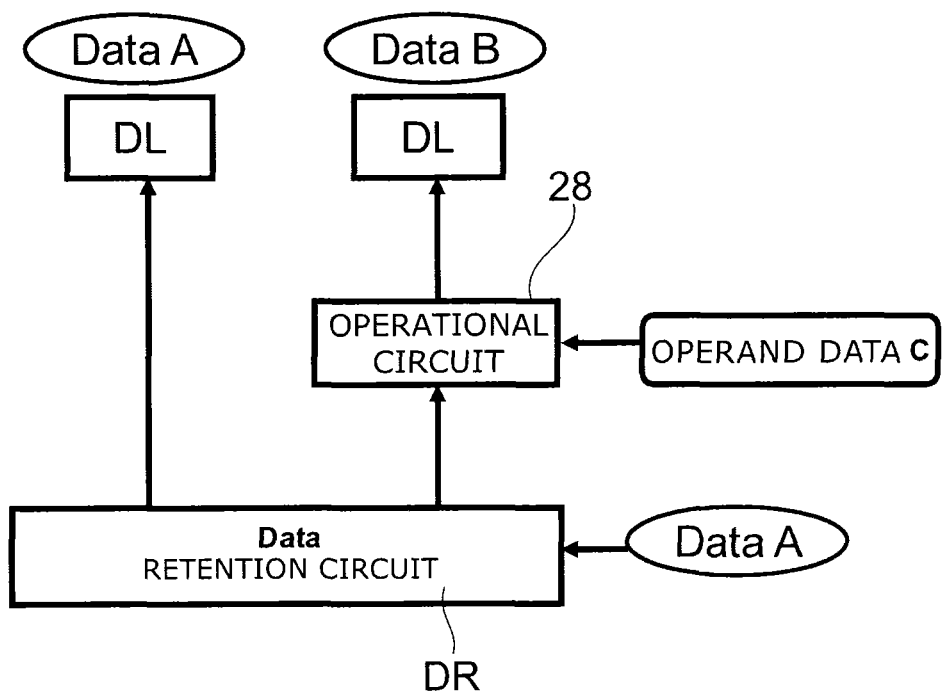
FIG. 8 is a schematic view of a part of a control circuit of a semiconductor memory device of a fourth embodiment.

FIG. 8 is a schematic view showing the configuration of a connection circuit between the data retention circuits DR and the data latch circuits DL according to a fourth embodiment.

An operational circuit 28 is connected via the bus B between the data retention circuit DR and the data latch circuit DL.

The operational circuit 28 performs e.g. OR operation or XOR operation between data A inputted to the data retention circuit DR and operand data C given from outside. Then, the operational circuit 28 outputs data B different from the data A to the data latch circuit DL.

Thus, without rewriting the original data A once inputted to the data retention circuit DR (without resetting the data retention circuit DR), a different kind of data can be created and sent to the data latch circuit DL.

If data A is inputted to the data retention circuit DR and transferred without operation in the operational circuit 28, then the data A is inputted to the data latch circuit DL.

The fourth embodiment can enhance randomness of data written to the data latch circuits DL while reducing the operation time and current consumption for overwriting the data retention circuit.

Fifth Embodiment

Figure 9:
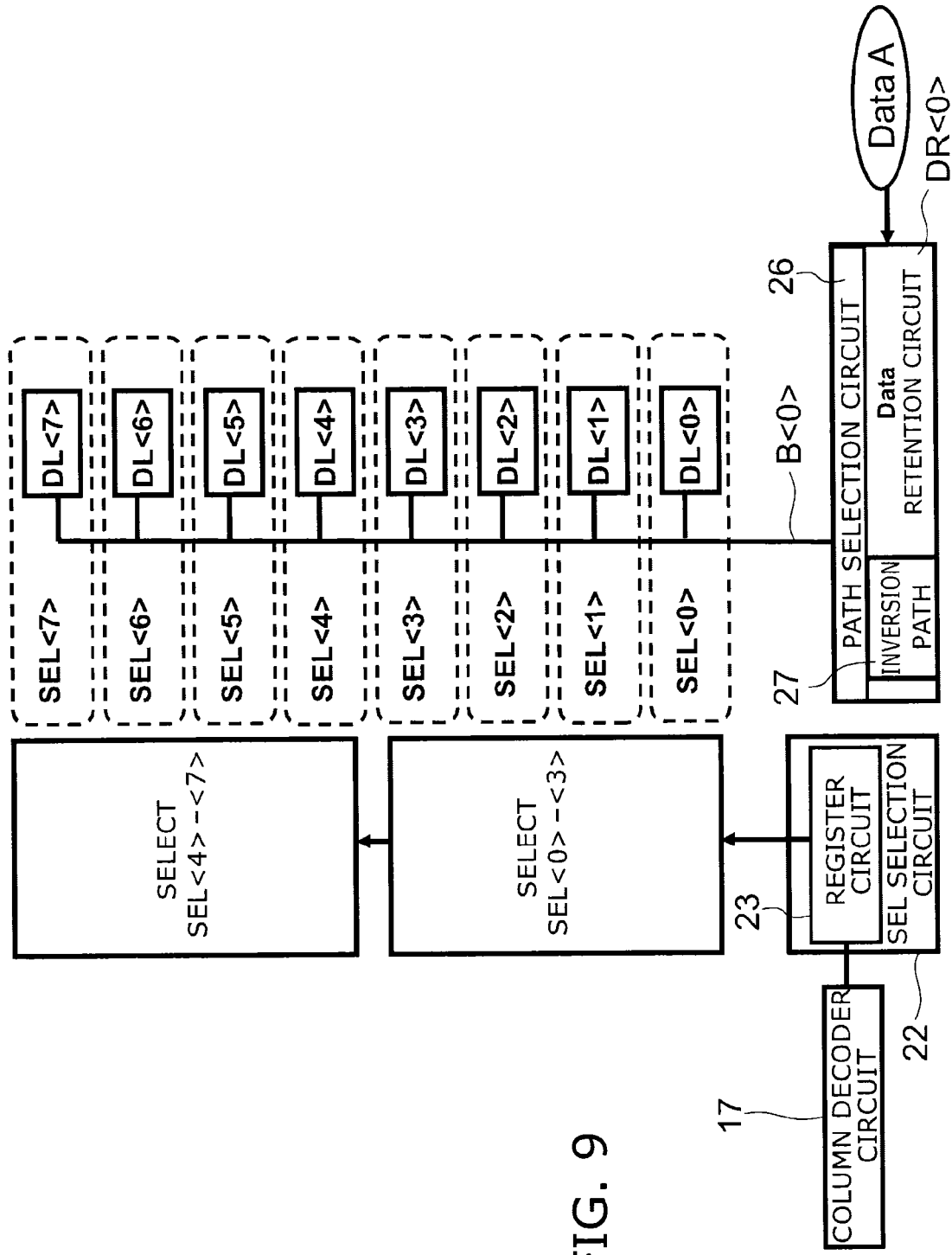
FIG. 9 is a schematic view of a part of a control circuit of a semiconductor memory device of a fifth embodiment.

FIG. 9 is a schematic view showing the configuration of a connection circuit between the data retention circuits DR and the data latch circuits DL according to a fifth embodiment.

The circuit of FIG. 9 has a combined configuration of the selection circuit 22 of the second embodiment shown in FIG. 6 and the path selection circuit 26 of the third embodiment shown in FIG. 7.

For instance, when the selection circuit 22 selects the groups SEL<0>-<3>, the data retention circuit DR accesses the data latch circuits DL<0>-<3> and transfers input data A to the data latch circuits DL<0>-<3>.

Next, when the selection circuit 22 selects the groups SEL<4>-<7>, the data retention circuit DR accesses the data latch circuits DL<4>-<7> and transfers the inverted data A-bar of the input data A to the data latch circuits DL<4>-<7>.

Thus, two kinds of data can be written to the data latch circuits DL<0>-<7>. This can enhance randomness of data written to the data latch circuits DL while reducing the operation time and current consumption for overwriting the data retention circuit.

Furthermore, the unit of accessing a plurality of data latch circuits DL is divided into a plurality of groups SEL. Furthermore, data is written to the data latch circuits DL in the same group SEL. This allows compatibility between the improvement of data write speed and the reduction of power consumption.

Sixth Embodiment

Figure 10:
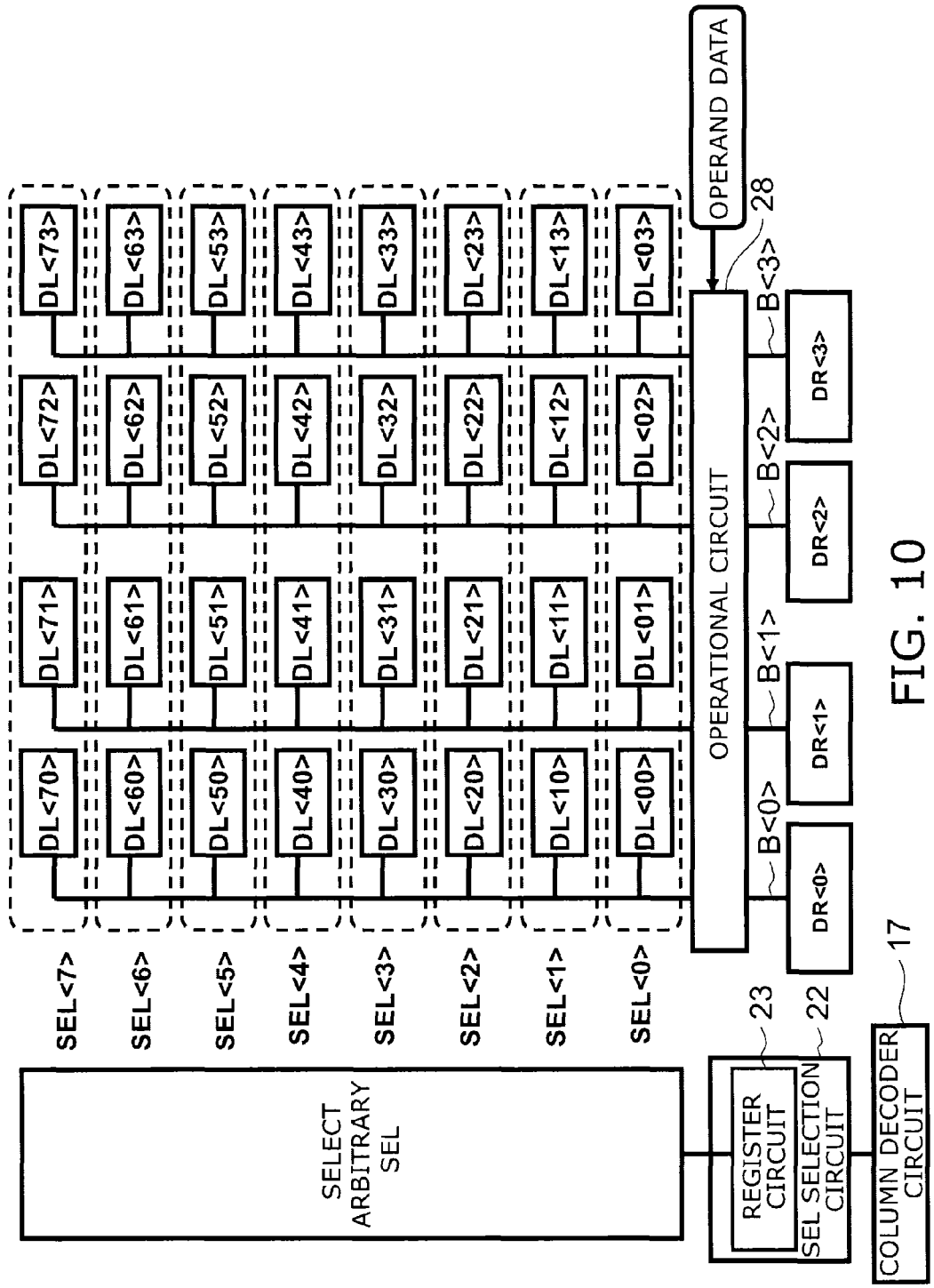
FIG. 10 is a schematic view of a part of a control circuit of a semiconductor memory device of a sixth embodiment.

FIG. 10 is a schematic view showing the configuration of a connection circuit between the data retention circuits DR and the data latch circuits DL according to a sixth embodiment.

The circuit of FIG. 10 has a combined configuration of the selection circuit 22 of the second embodiment and the operational circuit 28 of the fourth embodiment shown in FIG. 8.

The operational circuit 28 is connected between the data latch circuits DL<00>, <01>, <02>, <03> included in the group SEL<0> in first place counting from the data retention circuit DR side, and the data retention circuits DR<0>, <1>, <2>, <3>.

The selection circuit 22 selects one arbitrary group SEL of a plurality of (e.g., eight) groups SEL<0>-<7>.

When data is written to the data latch circuits DL, the data is changed by the operational circuit 28, and simultaneously, the register circuit 23 of the selection circuit 22 is controlled. Thus, data can be written to a plurality of data latch circuits DL.

For instance, each time the selection circuit 22 sequentially selects the groups SEL<0>-<7> one by one, the operand data given to the operational circuit 28 is changed. Thus, different data for each group SEL can be written to the data latch circuits DL.

This can enhance randomness of data written to the data latch circuits DL while reducing the operation time and current consumption for overwriting the data retention circuit. Furthermore, the unit of accessing a plurality of data latch circuits DL is divided into a plurality of groups SEL. Moreover, data is written to the data latch circuits DL in the same group SEL. This allows compatibility between the improvement of data write speed and the reduction of power consumption.

The path selection circuit 26 shown in FIG. 7 can be combined with each of the circuit shown in FIG. 4, the circuit shown in FIG. 5, and the circuit shown in FIG. 6.

The operational circuit 28 shown in FIG. 8 can also be combined with each of the circuit shown in FIG. 4, the circuit shown in FIG. 5, and the circuit shown in FIG. 6.

The grouping of the plurality of data latch circuits DL is not limited to the configurations shown in FIGS. 4 to 6, but other grouping methods are also possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   n (n being a natural number of 2 or more) data retention circuits connected to a data input/output terminal;
   n buses connected respectively to the n data retention circuits;
   m×n data latch circuits connected to the buses, with m (m being a natural number of 2 or more) data latch circuits being connected per one of the buses; and
   a selection circuit configured to simultaneously perform data transfer from/to the data retention circuits for a plurality of the data latch circuits in units of a group including the plurality of the data latch circuits, the data latch circuits being divided into the groups so that not all the data latch circuits connected to the same bus are included in the same group.

2. The device according to claim 1, wherein the selection of the group is switched in synchronization with timing of a clock.

3. The device according to claim 1, wherein the selection circuit includes a register circuit configured to simultaneously select a plurality of the groups.

4. The device according to claim 1, wherein
   the data retention circuit retains input data inputted to the data retention circuit and inverted data of the input data, and
   the data retention circuit includes a path configured to transfer the input data to the data latch circuits and an inversion path configured to transfer the inverted data to the data latch circuits.

5. The device according to claim 4, wherein the groups include a first group to which the input data is transferred and a second group to which the inverted data is transferred.

6. The device according to claim 4, wherein the selection circuit includes a register circuit configured to simultaneously select a plurality of the groups.

7. The device according to claim 1, further comprising:
   an operational circuit connected between the data retention circuit and the data latch circuits via the bus and configured to perform operation on input data inputted to the data retention circuit and to transfer data different from the input data to the data latch circuits.

8. The device according to claim 7, wherein the groups include a first group to which the input data is transferred and a second group to which data different from the input data is transferred.

9. The device according to claim 7, wherein the selection circuit includes a register circuit configured to simultaneously select a plurality of the groups.

10. The device according to claim 1, wherein one of the groups includes a plurality of the data latch circuits connected to a plurality of different ones of the buses.

11. The device according to claim 1, further comprising:
    a plurality of bit lines;
    word lines intersecting the bit lines; and
    memory cells provided at intersecting positions of the bit lines and the word lines,
    wherein potential of the bit line is controlled by data of the data latch circuit.

12. A semiconductor memory device comprising:
    n (n being a natural number of 2 or more) data retention circuits connected to a data input/output terminal;
    n buses connected respectively to the n data retention circuits; and
    m×n data latch circuits connected to the buses, with m (m being a natural number of 2 or more) data latch circuits being connected per one of the buses,
    the data retention circuit retaining input data inputted to the data retention circuit and inverted data of the input data, and
    the data retention circuit including a path configured to transfer the input data to the data latch circuits and an inversion path configured to transfer the inverted data to the data latch circuits.

13. The device according to claim 12, further comprising:
    a plurality of bit lines;
    word lines intersecting the bit lines; and
    memory cells provided at intersecting positions of the bit lines and the word lines, wherein potential of the bit line is controlled by data of the data latch circuit.

14. A semiconductor memory device comprising:

n (n being a natural number of 2 or more) data retention circuits connected to a data input/output terminal;

n buses connected respectively to the n data retention circuits;

m×n data latch circuits connected to the buses, with m (m being a natural number of 2 or more) data latch circuits being connected per one of the buses; and an operational circuit connected between the data retention circuit and the data latch circuits via the bus and configured to perform operation on input data inputted to the data retention circuit and to transfer data different from the input data to the data latch circuits.

15. The device according to claim 14, further comprising:

a plurality of bit lines;

word lines intersecting the bit lines; and memory cells provided at intersecting positions of the bit lines and the word lines, wherein potential of the bit line is controlled by data of the data latch circuit.

* * * * *